(12) United States Patent
Kesler (10) Patent No.: US 11,757,253 B2
(45) Date of Patent: Sep. 12, 2023

(54) VERTICAL CAVITY SURFACE EMITTING LASER WITH ACTIVE LAYER-SPECIFIC ADDRESSABILITY

(71) Applicant: Lumentum Operations LLC, San Jose, CA (US)

(72) Inventor: Benjamin Kesler, Sunnyvale, CA (US)

(73) Assignee: Lumentum Operations LLC, San Jose, CA (US)

( * ) Notice: Subject to any disclaimer, the term of this patent is extended or adjusted under 35 U.S.C. 154(b) by 244 days.

(21) Appl. No.: 17/030,782

(22) Filed: Sep. 24, 2020

(65) Prior Publication Data

US 2021/0367404 A1    Nov. 25, 2021

Related U.S. Application Data

(60) Provisional application No. 63/028,230, filed on May 21, 2020.

(51) Int. Cl.
| | |
|---|---|
| *H01S 5/183* | (2006.01) |
| *H01S 5/34* | (2006.01) |
| *H01S 5/042* | (2006.01) |
| *H01S 5/42* | (2006.01) |
| *H01S 5/30* | (2006.01) |

(52) U.S. Cl.
CPC ........ *H01S 5/18341* (2013.01); *H01S 5/0421* (2013.01); *H01S 5/18313* (2013.01); *H01S 5/18327* (2013.01); *H01S 5/18397* (2013.01); *H01S 5/3095* (2013.01); *H01S 5/3416* (2013.01); *H01S 5/423* (2013.01); *H01S 5/04254* (2019.08); *H01S 5/04256* (2019.08); *H01S 5/04257* (2019.08); *H01S 5/1833* (2013.01)

(58) Field of Classification Search
CPC .. H01S 5/1833; H01S 5/18341; H01S 5/3095; H01S 5/18397; H01S 5/183–18397; H01S 5/0424; H01S 5/04256
See application file for complete search history.

(56) References Cited

U.S. PATENT DOCUMENTS 5,533,041 A * 7/1996 Matsuda ............... H01S 5/0264
                                                        257/E31.096
5,963,568 A * 10/1999 Paoli ....................... H01S 5/423
                                                              372/96

(Continued)

FOREIGN PATENT DOCUMENTS

| CN | 113708215 A | * 11/2021 | .......... H01S 5/0421 |
| JP | S62291192 A | * 12/1987 | |

(Continued)

*Primary Examiner* — Tod T Van Roy
(74) *Attorney, Agent, or Firm* — Harrity & Harrity, LLP (57) ABSTRACT

A vertical cavity surface emitting laser (VCSEL) may include an epitaxial structure that includes a first active layer, a second active layer, and a tunnel junction therebetween. The VCSEL may include a set of contacts that are electrically connected to the epitaxial structure. The set of contacts may include three or more contacts, and the set of contacts may be electrically separated from each other on the VCSEL. At least one contact, of the set of contacts, may be electrically connected to the epitaxial structure at a depth between the first active layer and the second active layer.

20 Claims, 4 Drawing Sheets

(56) References Cited

U.S. PATENT DOCUMENTS

| | | | |
|---|---|---|---|
| 6,771,680 B2 * | 8/2004 | Bour | H01S 5/18366 372/87 |
| 6,936,486 B2 * | 8/2005 | Cheng | H01S 5/18305 438/42 |
| 7,881,357 B2 * | 2/2011 | Takahashi | H01S 5/18311 372/50.124 |
| 8,102,890 B2 * | 1/2012 | Masui | H01S 5/1833 372/50.1 |
| 8,509,277 B2 * | 8/2013 | Hattori | H01S 5/04254 372/50.121 |
| 8,660,161 B2 * | 2/2014 | Brenner | H01S 5/1021 372/46.01 |
| 10,290,996 B1 * | 5/2019 | Mathai | H01S 5/18388 |
| 10,903,622 B2 * | 1/2021 | Joseph | H01S 5/18308 |
| 11,081,861 B2 * | 8/2021 | Pai | H01S 5/04256 |
| 2004/0096996 A1 * | 5/2004 | Cheng | H01S 5/18305 438/22 |
| 2007/0071054 A1 * | 3/2007 | Takahashi | H01S 5/18311 372/50.1 |
| 2009/0001389 A1 * | 1/2009 | Wang | H01L 27/15 257/89 |
| 2011/0007764 A1 * | 1/2011 | Ledentsov | H01S 5/18341 977/762 |
| 2014/0345681 A1 | 11/2014 | Koshida et al. | |
| 2020/0112140 A1 * | 4/2020 | Jayaraman | H01S 5/18347 |
| 2020/0161833 A1 * | 5/2020 | Weichmann | H01S 5/18313 |
| 2021/0184432 A1 * | 6/2021 | Berk | H01S 5/18311 |
| 2021/0367404 A1 * | 11/2021 | Kesler | H01S 5/3416 |
| 2022/0247152 A1 * | 8/2022 | Koerner | H01S 5/18322 |

FOREIGN PATENT DOCUMENTS

| | | | | |
|---|---|---|---|---|
| JP | 2007227860 A | * | 9/2007 | |
| TW | 202145668 A | * | 12/2021 | H01S 5/0421 |
| WO | WO-2004047242 A1 | * | 6/2004 | H01S 5/18305 |
| WO | WO-2018234131 A1 | * | 12/2018 | H01S 5/0421 |
| WO | WO-2020061752 A1 | * | 4/2020 | H01S 5/02251 |
| WO | WO-2021196368 A1 | * | 10/2021 | H01S 5/0234 |

\* cited by examiner

VERTICAL CAVITY SURFACE EMITTING LASER WITH ACTIVE LAYER-SPECIFIC ADDRESSABILITY

CROSS-REFERENCE TO RELATED APPLICATION

This Patent application claims priority to U.S. Provisional Patent Application No. 63/028,230, filed on May 21, 2020, and entitled "MULTIPLE-JUNCTION VERTICAL CAVITY SURFACE EMITTING LASER WITH JUNCTION-SPECIFIC ADDRESSABILITY." The disclosure of the prior Application is considered part of and is incorporated by reference into this Patent Application.

TECHNICAL FIELD

The present disclosure relates generally to lasers and to a vertical-cavity surface-emitting laser (VCSEL) with active layer-specific addressability.

BACKGROUND

A vertical-emitting device, such as a vertical cavity surface emitting laser (VCSEL), may include a laser, an optical transmitter, and/or the like in which a beam is emitted in a direction perpendicular to a surface of a substrate (e.g., vertically from a surface of a semiconductor wafer). Multiple vertical-emitting devices may be arranged in one or more emitter arrays (e.g., VCSEL arrays) on a common substrate.

SUMMARY

In some implementations, a vertical cavity surface emitting laser (VCSEL) includes an epitaxial structure that includes a first active layer, a second active layer, and a tunnel junction therebetween; and a set of contacts that are electrically connected to the epitaxial structure, where the set of contacts includes three or more contacts, where the set of contacts are electrically separated from each other on the VCSEL, and where at least one contact, of the set of contacts, is electrically connected to the epitaxial structure at a depth between the first active layer and the second active layer.

In some implementations, a VCSEL array includes an epitaxial structure that includes: a first active layer, a second active layer, a tunnel junction between the first active layer and the second active layer, and one or more confinement layers above the second active layer; at least a first VCSEL and a second VCSEL defined in the epitaxial structure; and a set of contacts that are electrically connected to the epitaxial structure to provide electrical current to only one of the first active layer and the second active layer for the first VCSEL, and electrical current to both of the first active layer and the second active layer for the second VCSEL.

In some implementations, an optical source includes an emitter array that includes at least one emitter comprising: an epitaxial structure that includes a first active layer, a second active layer, and a tunnel junction therebetween; and a set of contacts that are electrically connected to the epitaxial structure at different depths within the epitaxial structure, where a first pair of contacts, of the set of contacts, is configured to provide electrical current to only one of the first active layer and the second active layer, and where a second pair of contacts, of the set of contacts, is configured to provide electrical current to both of the first active layer and the second active layer.

DETAILED DESCRIPTION

The following detailed description of example implementations refers to the accompanying drawings. The same reference numbers in different drawings may identify the same or similar elements.

As described above, a vertical-emitting device, such as a vertical cavity surface emitting laser (VCSEL), is a laser in which a beam is emitted in a direction perpendicular to a surface of a substrate (e.g., vertically from a surface of a semiconductor wafer). In some cases, a device may employ a single VCSEL, or may employ multiple VCSELs arranged in one or more emitter arrays on a common substrate (e.g., on a singlet die, on a single chip, and/or the like).

A VCSEL may be formed in epitaxial layers, of an epitaxial structure, that include one or more active layers (e.g., gain regions) at semiconductor junctions (e.g., p-n junctions) in the epitaxial layers. A VCSEL may include a single active layer (which may be referred to as a single-junction VCSEL) or multiple active layers (which may be referred to as a multi-junction VCSEL). Current single junction or multi junction VCSELs may employ two electrical contacts (e.g., an anode contact and a cathode contact), which may be located at a top surface and a bottom surface of the VCSEL. In such a case, at a fixed temperature, it may not be possible to change an optical power of the VCSEL unless an input current to the VCSEL is changed (thereby changing a voltage across the VCSEL), or an input voltage to the VCSEL is changed (thereby changing a current across the VCSEL). Accordingly, VCSELs are typically designed for use at a specific drive current or a specific drive voltage. As a result, potential uses of the VCSEL may be limited single-output power applications.

In some cases, VCSELs need to meet multiple sets of optical power specifications, using different drive currents, to support operating the VCSEL in both low power and high power scenarios (e.g., for indoor and outdoor applications, for high and low resolution applications, for flood and time of flight (ToF) usage, and/or the like). These multiple sets of specifications may be difficult to meet, particularly across a range of temperatures in which the VCSEL could reach thermal runaway (e.g., if a high-current condition is too high) or suffer severe performance degradation (e.g., if a low-current condition causes the VCSEL to operate too close to a lasing threshold).

Moreover, VCSELs may use increased current in order to increase optical power. The use of increased current may be detrimental to VCSEL performance (e.g., an increase in current density may change beam parameters, such as a numerical aperture and/or a beam waist, and may cause thermal runaway if the input heat load becomes too large), or may be detrimental to VCSEL reliability (e.g., a higher current density may reduce the overall life of the VCSEL). In some cases, a driver of the VCSEL may not be capable of supplying the higher current. Accordingly, the VCSEL may not be suitable for some high-power applications, such as ToF applications, light detection and ranging (LIDAR) applications, and/or the like.

Some implementations described herein enable multiple optical output powers for a VCSEL or a VCSEL array. For example, the optical output power of a VCSEL may be varied (e.g., increased or decreased) while the VCSEL is operating in a constant current mode. In some implementations, switching an operating mode of a VCSEL, or an array of VCSELs, between a constant current mode and a constant voltage mode may also provide switching between multiple optical output powers.

In some implementations, an optical output power of a multi junction VCSEL may be varied by addressing (e.g., providing current to) different active layers of the VCSEL. For example, the VCSEL may be configured with different sets of contacts that electrically connect in the epitaxial layers at different depths. The different sets of contacts may be independently driven (e.g., at one or more constant currents) to selectively provide current to one or more of the active layers, thereby producing variation in the optical output power of the VCSEL.

In some implementations, a combined optical output power of a multi junction VCSEL array may be varied by addressing (e.g., providing current to) different active layers of the VCSEL array. For example, the VCSEL array may be configured with a set of contacts that electrically connect in the epitaxial layers at different depths for a first group of VCSELs and a second group of VCSELs of the VCSEL array. The set of contacts may be driven to selectively provide current to one or more of the active layers, thereby operating the first group of VCSELs and/or the second group of VCSELs.

In this way, a VCSEL and/or a VCSEL array may be capable of multiple optical output powers. For example, a VCSEL may be capable of multiple optical output powers while operating in a constant current mode. This may reduce or eliminate thermal runaway, improve the performance of the VCSEL, extend a useful life of the VCSEL, and/or the like. Moreover, the VCSEL and/or the VCSEL array may be suitable for a variety of applications that use switching between low and high optical powers, which otherwise would require more complex VCSEL design and/or fabrication. In addition, active layer-specific addressability allows the optical output power of the VCSEL to be controlled across a range of temperatures and provides improved VCSEL performance at higher temperatures.

Figure 1A:
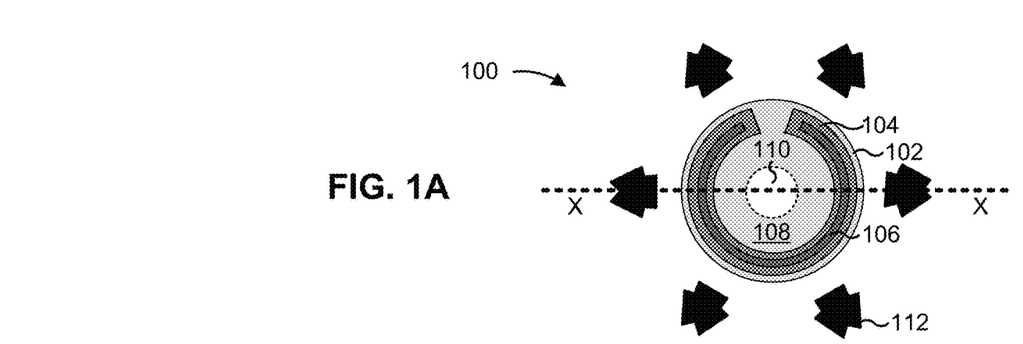
FIGS. 1A and 1B are diagrams depicting a top-view of an example emitter and a cross-sectional view of the example emitter along the line X-X, respectively.
Figure 1B:
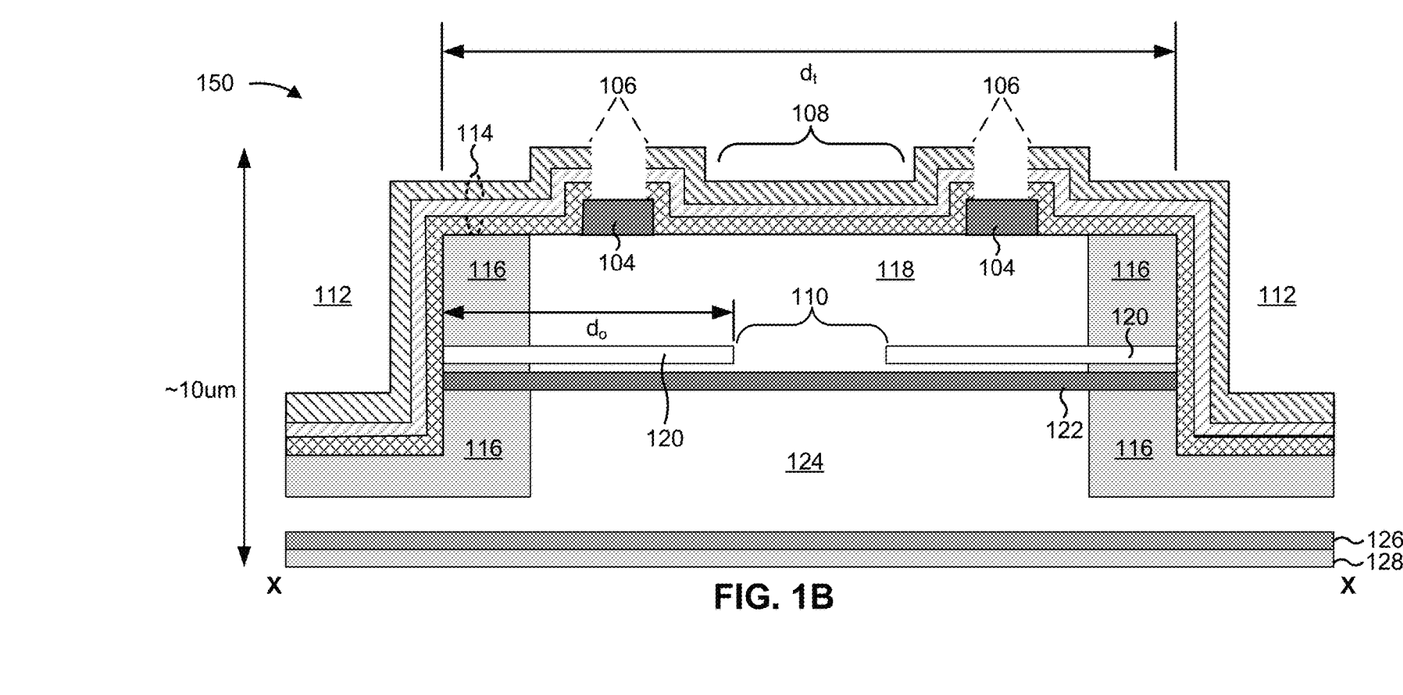

FIGS. 1A and 1B are diagrams depicting a top-view of an example emitter 100 and a cross-sectional view 150 of example emitter 100 along the line X-X, respectively. As shown in FIG. 1A, emitter 100 may include a set of emitter layers constructed in an emitter architecture. In some implementations, emitter 100 may correspond to one or more vertical-emitting devices described herein.

As shown in FIG. 1A, emitter 100 may include an implant protection layer 102 that is circular in shape in this example. In some implementations, implant protection layer 102 may have another shape, such as an elliptical shape, a polygonal shape, or the like. Implant protection layer 102 is defined based on a space between sections of implant material (not shown) included in emitter 100.

As shown by the medium gray and dark gray areas in FIG. 1A, emitter 100 includes an ohmic metal layer 104 (e.g., a P-Ohmic metal layer or an N-Ohmic metal layer) that is constructed in a partial ring-shape (e.g., with an inner radius and an outer radius). The medium gray area shows an area of ohmic metal layer 104 covered by a protective layer (e.g. a dielectric layer, a passivation layer, and/or the like) of emitter 100 and the dark gray area shows an area of ohmic metal layer 104 exposed by via 106, described below. As shown, ohmic metal layer 104 overlaps with implant protection layer 102. Such a configuration may be used, for example, in the case of a P-up/top-emitting emitter 100. In the case of a bottom-emitting emitter 100, the configuration may be adjusted as needed.

Not shown in FIG. 1A, emitter 100 includes a protective layer in which via 106 is formed (e.g., etched). The dark gray area shows an area of ohmic metal layer 104 that is exposed by via 106 (e.g., the shape of the dark gray area may be a result of the shape of via 106) while the medium grey area shows an area of ohmic metal layer 104 that is covered by some protective layer. The protective layer may cover all of the emitter other than the vias. As shown, via 106 is formed in a partial ring-shape (e.g., similar to ohmic metal layer 104) and is formed over ohmic metal layer 104 such that metallization on the protection layer contacts ohmic metal layer 104. In some implementations, via 106 and/or ohmic metal layer 104 may be formed in another shape, such as a full ring-shape or a split ring-shape.

As further shown, emitter 100 includes an optical aperture 108 in a portion of emitter 100 within the inner radius of the partial ring-shape of ohmic metal layer 104. Emitter 100 emits a laser beam via optical aperture 108. As further shown, emitter 100 also includes a current confinement aperture 110 (e.g., an oxide aperture formed by an oxidation layer of emitter 100 (not shown)). Current confinement aperture 110 is formed below optical aperture 108.

As further shown in FIG. 1A, emitter 100 includes a set of trenches 112 (e.g., oxidation trenches) that are spaced (e.g., equally, unequally) around a circumference of implant protection layer 102. How closely trenches 112 can be positioned relative to the optical aperture 108 is dependent on the application, and is typically limited by implant protection layer 102, ohmic metal layer 104, via 106, and manufacturing tolerances.

The quantity and arrangement of layers shown in FIG. 1A are provided as an example. In practice, emitter 100 may include additional layers, fewer layers, different layers, or differently arranged layers than those shown in FIG. 1A. For example, while emitter 100 includes a set of six trenches 112, in practice, other configurations are possible, such as a compact emitter that includes five trenches 112, seven trenches 112, and/or the like. In some implementations, trench 112 may encircle emitter 100 to form a mesa structure $d_t$. As another example, while emitter 100 is a circular emitter design, in practice, other designs may be used, such as a rectangular emitter, a hexagonal emitter, an elliptical emitter, or the like. Additionally, or alternatively, a set of layers (e.g., one or more layers) of emitter 100 may perform one or more functions described as being performed by another set of layers of emitter 100, respectively.

Notably, while the design of emitter 100 is described as including a VCSEL, other implementations are possible. For example, the design of emitter 100 may apply in the context of another type of optical device, such as a light emitting diode (LED), or another type of vertical emitting (e.g., top emitting or bottom emitting) optical device. Additionally, the design of emitter 100 may apply to emitters of any wavelength, power level, emission profile, and/or the like. In other words, emitter 100 is not particular to an emitter with a given performance characteristic.

As shown in FIG. 1B, the example cross-sectional view may represent a cross-section of emitter 100 that passes through, or between, a pair of trenches 112 (e.g., as shown by the line labeled "X-X" in FIG. 1A). As shown, emitter 100 may include a backside cathode layer 128, a substrate layer 126, a bottom mirror 124, an active region 122, an oxidation layer 120, a top mirror 118, an implant isolation material 116, a protective layer 114 (e.g. a dielectric passivation/mirror layer), and an ohmic metal layer 104. As shown, emitter 100 may have, for example, a total height that is approximately 10 μm.

Backside cathode layer 128 may include a layer that makes electrical contact with substrate layer 126. For example, backside cathode layer 128 may include an annealed metallization layer, such as an AuGeNi layer, a PdGeAu layer, or the like.

Substrate layer 126 may include a base substrate layer upon which epitaxial layers are grown. For example, substrate layer 126 may include a semiconductor layer, such as a such as a gallium arsenide (GaAs) layer, an indium phosphide (InP) layer, and/or the like.

Bottom mirror 124 may include a bottom reflector layer of emitter 100. For example, bottom mirror 124 may include a distributed Bragg reflector (DBR).

Active region 122 may include a layer that confines electrons and defines an emission wavelength of emitter 100. For example, active region 122 may be a quantum well.

Oxidation layer 120 may include an oxide layer that provides optical and electrical confinement of emitter 100. In some implementations, oxidation layer 120 may be formed as a result of wet oxidation of an epitaxial layer. For example, oxidation layer 120 may be an $Al_2O_3$ layer formed as a result of oxidation of an AlAs or AlGaAs layer. Trenches 112 may include openings that allow oxygen (e.g., dry oxygen, wet oxygen) to access the epitaxial layer from which oxidation layer 120 is formed.

Current confinement aperture 110 may include an optically active aperture defined by oxidation layer 120. A size of current confinement aperture 110 may range, for example, from approximately 4 μm to approximately 20 μm. In some implementations, a size of current confinement aperture 110 may depend on a distance between trenches 112 that surround emitter 100. For example, trenches 112 may be etched to expose the epitaxial layer from which oxidation layer 120 is formed. Here, before protective layer 114 is formed (e.g., deposited), oxidation of the epitaxial layer may occur for a particular distance (e.g., identified as do in FIG. 1B) toward a center of emitter 100, thereby forming oxidation layer 120 and current confinement aperture 110. In some implementations, current confinement aperture 110 may include an oxide aperture. Additionally, or alternatively, current confinement aperture 110 may include an aperture associated with another type of current confinement technique, such as an etched mesa, a region without ion implantation, lithographically defined intra-cavity mesa and regrowth, or the like.

Top mirror 118 may include a top reflector layer of emitter 100. For example, top mirror 118 may include a DBR.

Implant isolation material 116 may include a material that provides electrical isolation. For example, implant isolation material 116 may include an ion implanted material, such as a hydrogen/proton implanted material or a similar implanted element to reduce conductivity. In some implementations, implant isolation material 116 may define implant protection layer 102.

Protective layer 114 may include a layer that acts as a protective passivation layer and which may act as an additional DBR. For example, protective layer 114 may include one or more sub-layers (e.g., a dielectric passivation layer and/or a mirror layer, a $SiO_2$ layer, a $Si_3N_4$ layer, an $Al_2O_3$ layer, or other layers) deposited (e.g., by chemical vapor deposition, atomic layer deposition, or other techniques) on one or more other layers of emitter 100.

As shown, protective layer 114 may include one or more vias 106 that provide electrical access to ohmic metal layer 104. For example, via 106 may be formed as an etched portion of protective layer 114 or a lifted-off section of protective layer 114. Optical aperture 108 may include a portion of protective layer 114 over current confinement aperture 110 through which light may be emitted.

Ohmic metal layer 104 may include a layer that makes electrical contact through which electrical current may flow. For example, ohmic metal layer 104 may include a Ti and Au layer, a Ti and Pt layer and/or an Au layer, or the like, through which electrical current may flow (e.g., through a bondpad (not shown) that contacts ohmic metal layer 104 through via 106). Ohmic metal layer 104 may be P-ohmic, N-ohmic, or other forms known in the art. Selection of a particular type of ohmic metal layer 104 may depend on the architecture of the emitters and is well within the knowledge of a person skilled in the art. Ohmic metal layer 104 may provide ohmic contact between a metal and a semiconductor and/or may provide a non-rectifying electrical junction and/or may provide a low-resistance contact. In some implementations, emitter 100 may be manufactured using a series of steps. For example, bottom mirror 124, active region 122, oxidation layer 120, and top mirror 118 may be epitaxially grown on substrate layer 126, after which ohmic metal layer 104 may be deposited on top mirror 118. Next, trenches 112 may be etched to expose oxidation layer 120 for oxidation. Implant isolation material 116 may be created via ion implantation, after which protective layer 114 may be deposited. Via 106 may be etched in protective layer 114 (e.g., to expose ohmic metal layer 104 for contact). Plating, seeding, and etching may be performed, after which substrate layer 126 may be thinned and/or lapped to a target thickness. Finally, backside cathode layer 128 may be deposited on a bottom side of substrate layer 126.

The quantity, arrangement, thicknesses, order, symmetry, or the like, of layers shown in FIG. 1B is provided as an example. In practice, emitter 100 may include additional layers, fewer layers, different layers, differently constructed layers, or differently arranged layers than those shown in FIG. 1B. Additionally, or alternatively, a set of layers (e.g., one or more layers) of emitter 100 may perform one or more functions described as being performed by another set of layers of emitter 100 and any layer may comprise more than one layer.

Figure 2:
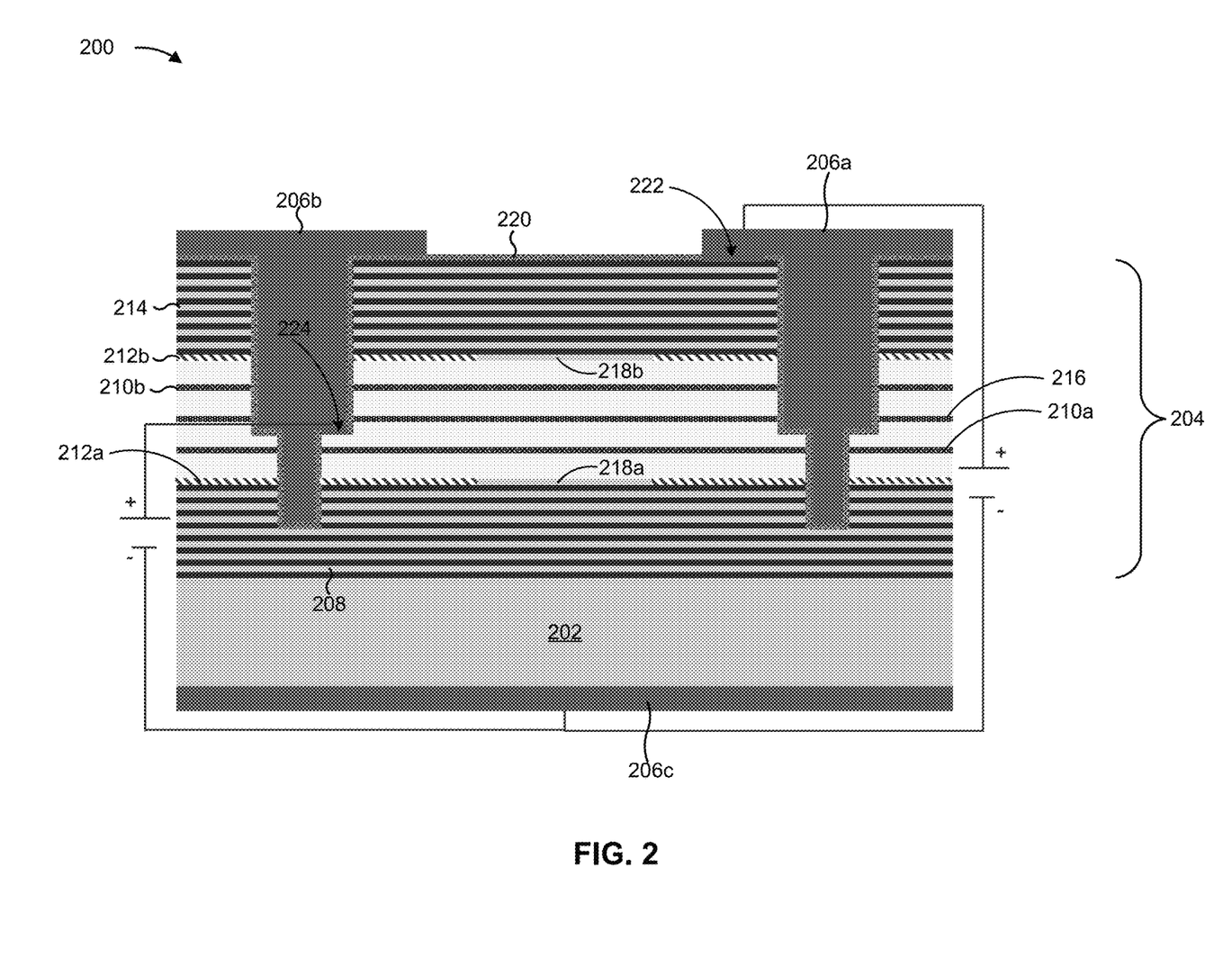
FIG. 2 is a diagram of an example cross-section of an emitter described herein.

FIG. 2 is a diagram of an example cross-section of an emitter 200. FIG. 2 illustrates a top-emitting configuration of the emitter 200; however, a bottom-emitting configuration is also contemplated. The emitter 200 may be an emitter 100 as described above in connection with FIGS. 1A and 1B. For example, the emitter 200 may be a VCSEL.

As shown in FIG. 2, the emitter 200 may include a substrate 202, an epitaxial structure 204, and a set of contacts 206 (shown as 206a, 206b, and 206c). The epitaxial structure 204 may include a bottom mirror 208, one or more active layers 210a, 210b, one or more confinement layers 212a, 212b, and a top mirror 214. In some implementations, the emitter 200 may be manufactured using a series of procedures. For example, one or more layers of the emitter 200 may be created using one or more growth procedures, one or more deposition procedures, one or more etching procedures, one or more oxidation procedures, one or more implantation procedures, one or more metallization procedures, and/or the like, as described above in connection with FIG. 1B.

The substrate 202 includes a substrate upon which layers of the epitaxial structure 204 are grown. In some implementations, the substrate 202 may be formed from a semiconductor material, as described above in connection with FIG. 1B.

The epitaxial structure 204 includes a set of layers grown on the substrate 202. For example, the epitaxial structure 204 may include an optical resonator including a pair of mirrors (e.g., mirrors 208, 214), one or more lenses associated with controlling an effective refractive index encountered by an output beam of the emitter 200, at least one active gain medium (which may be referred to as a gain region or an active region of an active layer), one or more layers used to form one or more apertures (e.g., for optical and/or electrical confinement), and/or the like, as described below. In some implementations, the epitaxial structure 204 may include a set of AlGaAs layers grown on the substrate 202 (e.g., a GaAs substrate). In some implementations, the epitaxial structure 204 may be grown on the substrate 202 using a metal-organic chemical vapor deposition (MOCVD) technique, a molecular beam epitaxy (MBE) technique, and/or the like.

The bottom mirror 208 and the top mirror 214 may form a part of an optical resonator of the emitter 200. For example, the bottom mirror 208 or the top mirror 214 may include a DBR, a dielectric mirror, and/or the like, as described above in connection with FIG. 1B.

The active layers may include a first active layer 210a and a second active layer 210b. The active layers 210a and 210b may each include an active region where electrons and holes recombine to emit light. For example, an active region may include one or more quantum wells. Each of the active layers 210a, 210b may be located at a respective semiconductor junction of the epitaxial structure 204. A semiconductor junction may be a region at which oppositely-doped semiconductor material meets. For example, the first active layer 210a may be at a first p-n junction, and the second active layer 210b may be at a second p-n junction. The emitter 200 may include two or more semiconductor junctions/active layers. That is, the emitter 200 may be a multi junction emitter.

As shown, a tunnel junction region 216 may be between the active layers 210a, 210b. A tunnel junction may be formed of layers (e.g., thin layers) of highly-doped semiconductor materials (e.g., one or more n++ layers and one or more p++ layers). The tunnel junction region 216 may refer to a region that provides recycling of carriers so that the carriers can be used for additional stimulated recombination events. Thus, a pair of active layers of the epitaxial structure 204 may have a tunnel junction region therebetween.

The confinement layers 212a, 212b may provide optical and/or electrical (e.g., current) confinement. In some implementations, the confinement layers 212a, 212b may include oxide layers that are formed as a result of oxidation of one or more epitaxial layers of epitaxial structure 204, as described above in connection with FIG. 1B. The confinement layers 212a, 212b may define respective optical apertures 218a, 218b. The optical apertures 218a, 218b may include confinement regions of the confinement layers 212a, 212b. In some implementations, the confinement layers 212a, 212b may provide optical confinement, and electrical confinement may be provided by another structure or mechanism of the emitter 200 so long as the electrical confinement enables carriers to radiatively recombine via stimulated emission to be emitted as light from the emitter 200.

The epitaxial structure 204 may include one or more first confinement layers (e.g., confinement layer 212a) at a depth below the first active layer 210a. In addition, the epitaxial structure 204 may include one or more second confinement layers (e.g., confinement layer 212b) at a depth above the second active layer 210b. In some implementations, the first confinement layer(s) and the second confinement layer(s) are vertically aligned. That is, optical apertures (e.g., optical apertures 218a and 218b) of the first confinement layer(s) and the second confinement layer(s) may be axially aligned. In some implementations, the epitaxial structure 204 may include one or more confinement layers at a depth between the first active layer 210a and the second active layer 210b. In some implementations, the epitaxial structure 204 may include more than two active layers, and one or more confinement layers may be located above an upper-most active layer, below a lower-most active layer, and/or between active layers.

The set of contacts 206 may have electrical connections to the epitaxial structure 204. A contact of the set of contacts 206 may include an electrically-conductive material through which electrical current may flow, as described above in connection with FIG. 1B. In some implementations, the set of contacts 206 may include three or more contacts. Moreover, the set of contacts 206 may be electrically separated from each other on the emitter 200. In some implementations, each contact of the set of contacts 206 may be electrically connected to the epitaxial structure 204 at a depth that is different from a depth at which any other contact is electrically connected to the epitaxial structure 204. For example, at least one contact of the set of contacts 206 may be electrically connected to the epitaxial structure at a depth between the first active layer 210a and the second active layer 210b. In some implementations, the set of contacts 206 may be electrically connected to different layers of the epitaxial structure 204.

As shown in FIG. 2, the set of contacts 206 may include a first anode contact 206a, a second anode contact 206b, and a cathode contact 206c. The anode contacts 206a, 206b may include contact layers formed in respective trenches etched into the epitaxial structure 204. In some implementations, at least one of the anode contacts 206a or 206b may electrically connect to the epitaxial structure 204 within the trench.

A trench may have a stepped shape (e.g., of one or more steps), such that the trench includes one or more lateral sections (e.g., parallel to the substrate 202). In some implementations, an electrical isolation layer 220 may line a top surface of the epitaxial structure 204 and line a surface of the trenches. The electrical isolation layer 220 may include a non-conductive material that provides electrical isolation between one or more contacts (e.g., the anode contacts 206a, 206b) and the epitaxial structure 204. The electrical isolation layer 220 may include one or more gaps (e.g., etched sections where the non-conductive material is not present) to permit an electrical connection between a contact and the epitaxial structure 204. For example, a portion of the electrical isolation layer 220, associated with a lateral section of a trench, may include a gap to form an anode contact into the epitaxial structure 204, as described in further detail below. In some implementations, a portion of the trench may extend down into the epitaxial structure 204 beyond the gap, and into the bottom mirror 208 or the substrate 202. In this way, the first anode contact 206a and the second anode contact 206b are electrically isolated from one another (e.g., the first anode contact 206a and the second anode contact 206b are separate, independent contacts), and/or electrically isolated from another emitter in an array with the emitter 200.

The cathode contact 206c may include a contact layer at a backside of the emitter 200 in electrical contact with the substrate 202 (e.g., at a back surface of the substrate 202). Alternatively, the cathode contact 206c may include a contact layer at a top-side of the emitter 200 (i.e., a same side as the anode contacts 206a, 206b) that is formed in a trench that extends into, and provides an electrical connection to, the substrate 202.

In some implementations, the emitter 200 may be connected to a driver component (e.g., a driver circuit). The driver component may be configured to apply a bias (e.g., provide an electrical current) to the emitter 200 via separate pairs of the set of contacts 206. For example, the driver component may be configured to apply a bias to the emitter 200 via the first anode contact 206a and the cathode contact 206c or to apply a bias to the emitter 200 via the second anode contact 206b and the cathode contact 206c. For example, the driver component may be configured to switch between driving the first anode contact 206a and the cathode contact 206c or the second anode contact 206b and the cathode contact 206c. In other words, the set of contacts 206 may include at least two pairs of contacts that are configured to be independently driven, and the driver component may be configured to switch driving the emitter 200 using different pairs of contacts. The pairs of contacts may share one or more contacts (e.g., as shown, a first pair of contacts includes the first anode contact 206a and the cathode contact 206c, and a second pair of contacts includes the second anode contact 206b and the cathode contact 206c).

The set of contacts 206 may be electrically connected to the epitaxial structure 204 to selectively provide current to one or both of the first active layer 210a and the second active layer 210b. For example, a first pair of the set of contacts 206 (e.g., the first anode contact 206a and the cathode contact 206c) may be electrically connected to the epitaxial structure 204 to provide current to both of the first active layer 210a and the second active layer 210b. As another example, a second pair of the set of contacts 206 (e.g., the second anode contact 206b and the cathode contact 206c) may be electrically connected to the epitaxial structure 204 to provide current to only one of the first active layer 210a and the second active layer 210b. In this way, the emitter 200 may be capable of multiple optical output powers according to which of the active layers are supplied with current. For example, the emitter 200 may operate at a relatively lower optical output power (e.g., half power) if the first active layer 210a is on and the second active layer 210b is off, and the emitter 200 may operate at a relatively higher optical output power (e.g., full power) if the first active layer 210a and the second active layer 210b are both on.

In some implementations, the emitter 200 may operate in a constant current mode (e.g., the driver component may be configured to supply a constant current to the emitter 200). For example, the emitter 200 may operate using a constant current regardless of whether one or both of the first active layer 210a and the second active layer 210b are to be on. In some implementations, the emitter 200 may operate in a constant voltage mode (e.g., the driver component may be configured to supply a constant voltage to the emitter 200). For example, the emitter 200 may operate using a constant voltage when only one of the first active layer 210a and the second active layer 210b is to be on (e.g., when the emitter 200 is to operate at the relatively lower optical output power).

In some implementations, the first anode contact 206a may have an electrical connection to the epitaxial structure 204 at the top surface of the epitaxial structure 204. For example, the first anode contact 206a may have an electrical connection to the epitaxial structure 204 at the top mirror 214. As shown by reference number 222, the electrical isolation layer 220 may include a gap at the top surface of the epitaxial structure 204 to provide the electrical connection between the first anode contact 206a and the epitaxial structure 204.

In some implementations, the second anode contact 206b is electrically connected in the epitaxial structure 204 at a depth that is different from a depth at which any other anode contact (e.g., the first anode contact 206a) is electrically connected in the epitaxial structure 204. For example, the first anode contact 206a and the second anode contact 206b may be electrically connected in the epitaxial structure 204 at different depths (e.g. electrically connected to different layers in the epitaxial structure). In some implementations, the second anode contact 206b may have an electrical connection to the epitaxial structure 204 between the first active layer 210a and the second active layer 210b. In some implementations, the second anode contact 206b is electrically connected to the epitaxial structure 204 at a depth between the tunnel junction region 216 and the first active layer 210a. In this way, the electrical path between the second anode contact 206b and the cathode contact 206c may bypass the additional resistance of the tunnel junction region 216. In some implementations, the second anode contact 206b is electrically connected to the epitaxial structure 204 at a depth between the tunnel junction region 216 and the second active layer 210b. As shown by reference number 224, and as described above, the electrical isolation layer 220 may include a gap to provide the electrical connection between the second anode contact 206b and the epitaxial structure 204. For example, the gap may be located at a lateral section of a trench filled by the second anode contact 206b. In this way, an electrical path between the second anode contact 206b and the cathode contact 206c may bypass the second active layer 210b.

In some implementations, at least one confinement layer (e.g., a confinement region of a confinement layer) is in an electrical path between an anode contact and a cathode contact of the set of contacts 206. For example, both of confinement layers 212a and 212b may be in an electrical path between the first anode contact 206a and the cathode contact 206c, and only one of confinement layers 212a and 212b may be in an electrical path between the second anode contact 206b and the cathode contact 206c.

In some implementations, only one of the first active layer 210a and the second active layer 210b is in an electrical path between a first anode-cathode pair of the set of contacts 206, and both of the first active layer 210a and the second active layer 210b are in an electrical path between a second anode-cathode pair of the set of contacts 206. For example, only the first active layer 210a (e.g., not the second active layer 210b) may be in an electrical path between the second anode contact 206b and the cathode contact 206c, and the first active layer 210a and the second active layer 210b may be in an electrical path between the first anode contact 206a and the cathode contact 206c.

In this way, driving the emitter 200 using the first anode contact 206a and the cathode contact 206c provides current to the first active layer 210a and the second active layer 210b (i.e., multi junction operation) resulting in a relatively higher optical output power, and driving the emitter 200 using the second anode contact 206b and the cathode contact 206c provide current to the first active layer 210a but not to the second active layer 210b (i.e., single junction operation) resulting in a relatively lower optical output power. Accordingly, the emitter 200 may be capable of switching between a lower power mode and a higher power mode, between an indoor mode and an outdoor mode, between a daytime mode and a nighttime mode, between a shorter-distance mode and a longer-distance mode, and/or the like.

Although the emitter 200 is described above as including two active layers, with a tunnel junction therebetween, and three contacts, the emitter 200 may include more than two active layers (e.g. with tunnel junctions between successive active layers), and more than three contacts. For example, the emitter 200 may include a third active layer above the second active layer 210b, and an additional tunnel junction at a depth in the epitaxial structure 204 between the second active layer 210b and the third active layer. Here, the set of contacts 206 may include a third anode contact (e.g., that is independent and electrically isolated from the anode contacts 206a, 206b), and the set of contacts 206 may be electrically connected to the epitaxial structure 204 such that select pairs of contacts provide electrical current to a subset of the first active layer 210a, the second active layer 210b, and the third active layer. For example, a first pair of contacts may provide electrical current to only the first active layer 210a, a second pair of contacts may provide electrical current to only the first active layer 210a and the second active layer 210b, and a third pair of contacts may provide electrical current to the first active layer 210a, the second active layer 210b, and the third active layer, in a manner similar to that described above.

As another example, the emitter 200 may include four active layers, three tunnel junctions, and four anode contacts (e.g., which are independent and electrically isolated), and the four anode contacts may electrically connect to the epitaxial structure 204 at different depths to provide four-level optical output power control. For example, a single active layer may be addressed to provide a first power level (e.g., low power), two active layers may be addressed to provide a second power level (e.g., mid-low power), three active layers may be addressed to provide a third power level (e.g., mid-high power), or four active layers may be addressed to provide a fourth power level (e.g., high power).

In some implementations, when the quantity of active layers (N) is three or greater, the quantity of contacts needed to address all combinations of the active layers is N. In some implementations, when the quantity of active layers (N) is three or greater, the quantity of contacts needed to address the active layers individually is N+1.

In some implementations, two or more emitters 200 are included in an emitter array, such as in an emitter array on a common substrate. For example, the emitter array (e.g., an emitter chip) may include a first sub-array of at least one emitter 200, a second sub-array of at least one emitter 200, and so forth. The sub-arrays may be interleaved or non-interleaved, and each sub-array may use a separate current supply. In this case, the sub-arrays may be operated independently to provide a variety of optical outputs (e.g., without changing a drive current). For example, both sub-arrays may be operated at high power, the first sub-array may be operated at high power and the second sub-array operated at low power, both sub-arrays may be operated at low power, and so forth.

As indicated above, FIG. 2 is provided as an example. Other examples may differ from what is described with regard to FIG. 2. The quantity and arrangement of layers shown in FIG. 2 are provided as an example. In practice, the emitter 200 may include additional layers, fewer layers, different layers, or differently arranged layers than those shown in FIG. 2. For example, the emitter 200 may be modified as needed for sufficient carrier confinement (e.g., by including additional confinement layers, by increasing a spacing between active layers, by modifying doping in, and adjacent to, contact layers, and/or the like). Additionally, or alternatively, a set of layers (e.g., one or more layers) of the emitter 200 may perform one or more functions described as being performed by another set of layers of the emitter 200.

Figure 3:
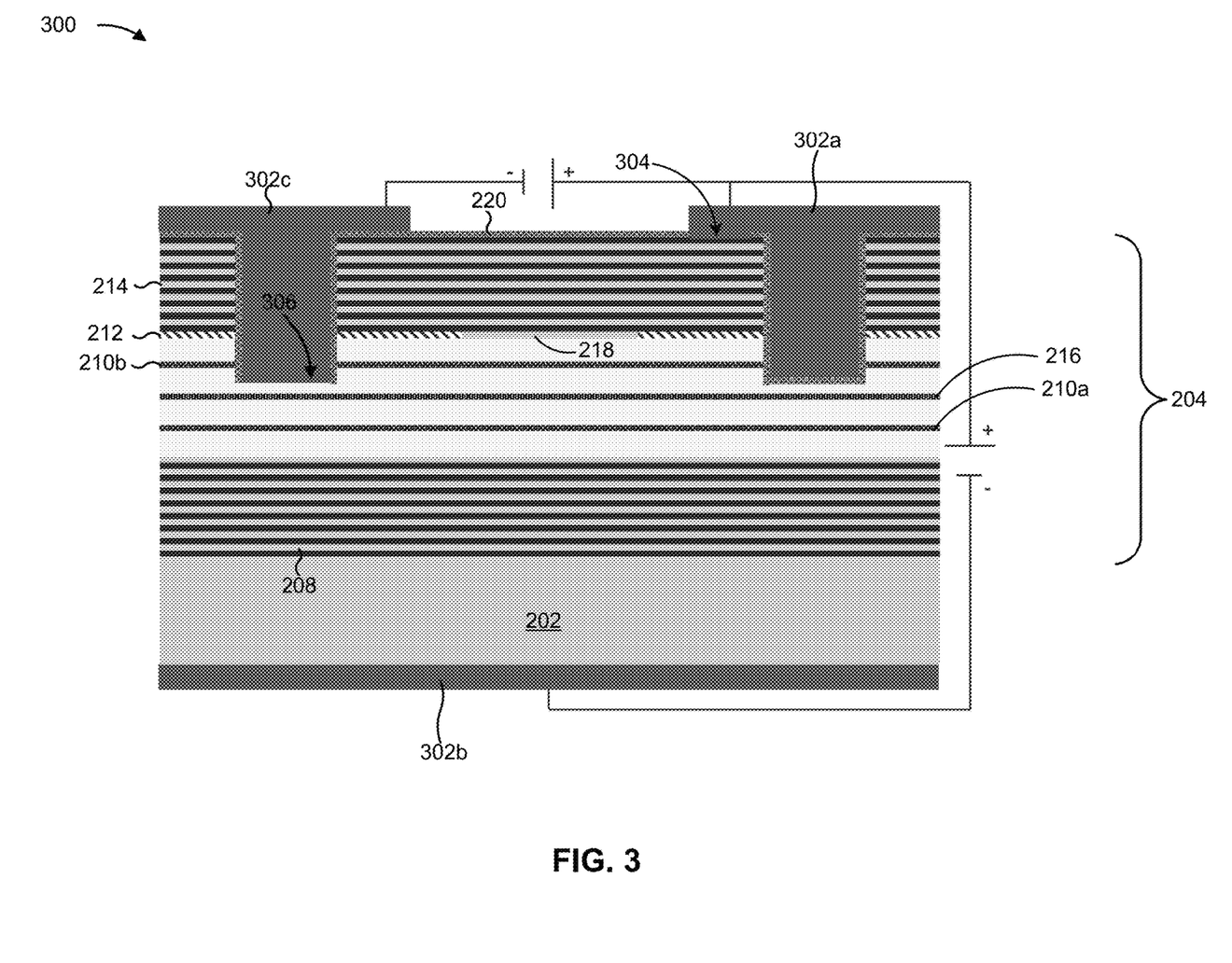
FIG. 3 is a diagram of an example cross-section of an emitter described herein.

FIG. 3 is a diagram of an example cross-section of an emitter 300. FIG. 3 illustrates a top-emitting configuration of the emitter 300, however, a bottom-emitting configuration is also contemplated. The emitter 300 may be an emitter 100 as described above in connection with FIGS. 1A and 1B. For example, the emitter 300 may be a VCSEL.

As shown in FIG. 3, the emitter 300 may include a substrate 202 and an epitaxial structure 204, as described above in connection with FIG. 2. The epitaxial structure 204 may include a bottom mirror 208, one or more active layers 210a, 210b, one or more confinement layers 212 (shown as a single confinement layer 212), a top mirror 214, a tunnel junction region 216 between the active layers 210a and 210b, and an electrical isolation layer 220, as described above in connection with FIG. 2.

The emitter 300 may include a set of contacts 302 (shown as 302a, 302b, and 302c). As shown in FIG. 3, the set of contacts 302 may include an anode contact 302a, a first cathode contact 302b, and a second cathode contact 302c. The anode contact 302a and the second cathode contact 302c may include layers formed in trenches etched into the epitaxial structure 204. In some implementations, the cathode contact 302c may electrically connect to the epitaxial structure 204 within the trench. As shown, the trenches may extend into the epitaxial structure 204 between the active layers 210a, 210b. In some implementations, the electrical isolation layer 220 may line a top surface of the epitaxial structure 204 and line a surface of the trenches, as described above.

The first cathode contact 302b may include a layer at a backside of the emitter 300 in electrical contact with the substrate 202, as described above. Alternatively, the first cathode contact 302b may include a layer at a top-side of the emitter 300 (i.e., a same side as the anode contact 302a and the second cathode contact 302c) that is formed in a trench that extends into, and provides an electrical connection to, the substrate 202, as described above. In some implementations, the first cathode contact 302b and the second cathode contact 302c are electrically isolated from one another (e.g., the first cathode contact 302b and the second cathode contact 302c are separate, independent contacts).

In some implementations, the emitter 300 may be connected to a driver component (e.g., a driver circuit), as described above in connection with FIG. 2. For example, the driver component may be configured to apply a bias to the emitter 300 via the anode contact 302a and the first cathode contact 302b or to apply a bias to the emitter 300 via the anode contact 302a and the second cathode contact 302c. For example, the driver component may be configured to switch between driving the anode contact 302a and the first cathode contact 302b or the anode contact 302a and the second cathode contact 302c.

The set of contacts 302 may be electrically connected to the epitaxial structure 204 to selectively provide current to one or both of the first active layer 210a and the second active layer 210b, as described above in connection with FIG. 2. For example, a first pair of the set of contacts 302 (e.g., the anode contact 302a and the first cathode contact 302b) may be electrically connected to the epitaxial structure 204 to provide current to both of the first active layer 210a and the second active layer 210b. As another example, a second pair of the set of contacts 302 (e.g., the anode contact 302a and the second cathode contact 302c) may be electrically connected to the epitaxial structure 204 to provide current to only one of the first active layer 210a and the second active layer 210b.

In some implementations, the anode contact 302a may have an electrical connection to the epitaxial structure 204 at the top surface of the epitaxial structure 204, as described above in connection with FIG. 2. As shown by reference number 304, the electrical isolation layer 220 may include a gap at the top surface of the epitaxial structure 204 to permit an electrical connection between the anode contact 302a and the epitaxial structure 204.

In some implementations, the second cathode contact 302c is electrically connected in the epitaxial structure 204 at a depth that is different from a depth at which any other cathode contact (e.g., the first cathode contact 302b) is electrically connected in the epitaxial structure 204. For example, the first cathode contact 302b and the second cathode contact 302c may be electrically connected in the epitaxial structure 204 at different depths. In some implementations, the second cathode contact 302c may have an electrical connection to the epitaxial structure 204 between the first active layer 210a and the second active layer 210b. In some implementations, the second cathode contact 302c is electrically connected to the epitaxial structure 204 at a depth between the tunnel junction region 216 and the first active layer 210a, or between the tunnel junction region 216 and the second active layer 210b. As shown by reference number 306, the electrical isolation layer 220 may include a gap to provide the electrical connection between the second cathode contact 302c and the epitaxial structure 204. For example, the gap may be located at a bottom section of a trench filled by the second cathode contact 302c. In this way, an electrical path between the anode contact 302a and the second cathode contact 302c does not reach the second active layer 210b.

In some implementations, the emitter 300 may include a single confinement layer 212, and the confinement layer 212 (e.g., a confinement region of the confinement layer 212) is in an electrical path between the anode contact 302a and the first cathode contact 302b, and an electrical path between the anode contact 302a and the second cathode contact 302c. In some implementations, the emitter 300 may operate in a constant current mode or in a constant voltage mode, as described above in connection with FIG. 2.

In some implementations, only the second active layer 210b (e.g., not the first active layer 210a) is in an electrical path between the anode contact 302a and the second cathode contact 302c, and both of the first active layer 210a and the second active layer 210b are in an electrical path between the anode contact 302a and the first cathode contact 302b. Accordingly, the emitter 300 may have one or more of the capabilities (e.g., single junction operation or multiple-junction operation, a low-power mode or a high-power mode, and/or the like) as described above in FIG. 2 for the emitter 200.

Although the emitter 300 is described above as including two active layers, with a tunnel junction therebetween, and three contacts, the emitter 300 may include more than two active layers, more than one tunnel junction, and more than three contacts, as described above in connection with FIG. 2. For example, the emitter 300 may include a third active layer above the second active layer 210b, and an additional tunnel junction at a depth in the epitaxial structure 204 between the second active layer 210b and the third active layer. Here, the set of contacts 206 may include a third cathode contact (e.g., that is independent and electrically isolated from the cathode contacts 302b, 302c), and the set of contacts 302 may be electrically connected to the epitaxial structure 204 such that select pairs of contacts provide electrical current to a subset of the first active layer 210a, the second active layer 210b, and the third active layer, as described above in connection with FIG. 2.

In some implementations, two or more emitters 300 are included in an emitter array, such as in an emitter array on a common substrate, as described above in connection with FIG. 2. In some implementations, at least one emitter 200 and at least one emitter 300 are included in an emitter array. In some implementations, any contact of the set of contacts 302 may be a ground contact, and the driver circuitry may be configured so that the other contacts of the set of contacts 302 are biased relative to the ground contact (e.g., to provide active layer-specific addressability, as described above). For example, FIG. 2 shows a scheme using two anode contacts and a single cathode contact, while FIG. 3 shows a scheme using a single anode contact and two cathode contacts. Other schemes are contemplated provided that driving an emitter between different pairs of contacts provides current to different sets of active layers of the emitter.

As indicated above, FIG. 3 is provided as an example. Other examples may differ from what is described with regard to FIG. 3. The quantity and arrangement of layers shown in FIG. 3 are provided as an example. In practice, the emitter 300 may include additional layers, fewer layers, different layers, or differently arranged layers than those shown in FIG. 3. For example, the emitter 300 may be modified as needed for sufficient carrier confinement (e.g., by including additional confinement layers, by increasing a spacing between active layers, by modifying doping in, and adjacent to, contact layers, and/or the like). Additionally, or alternatively, a set of layers (e.g., one or more layers) of the emitter 300 may perform one or more functions described as being performed by another set of layers of the emitter 300.

Figure 4:
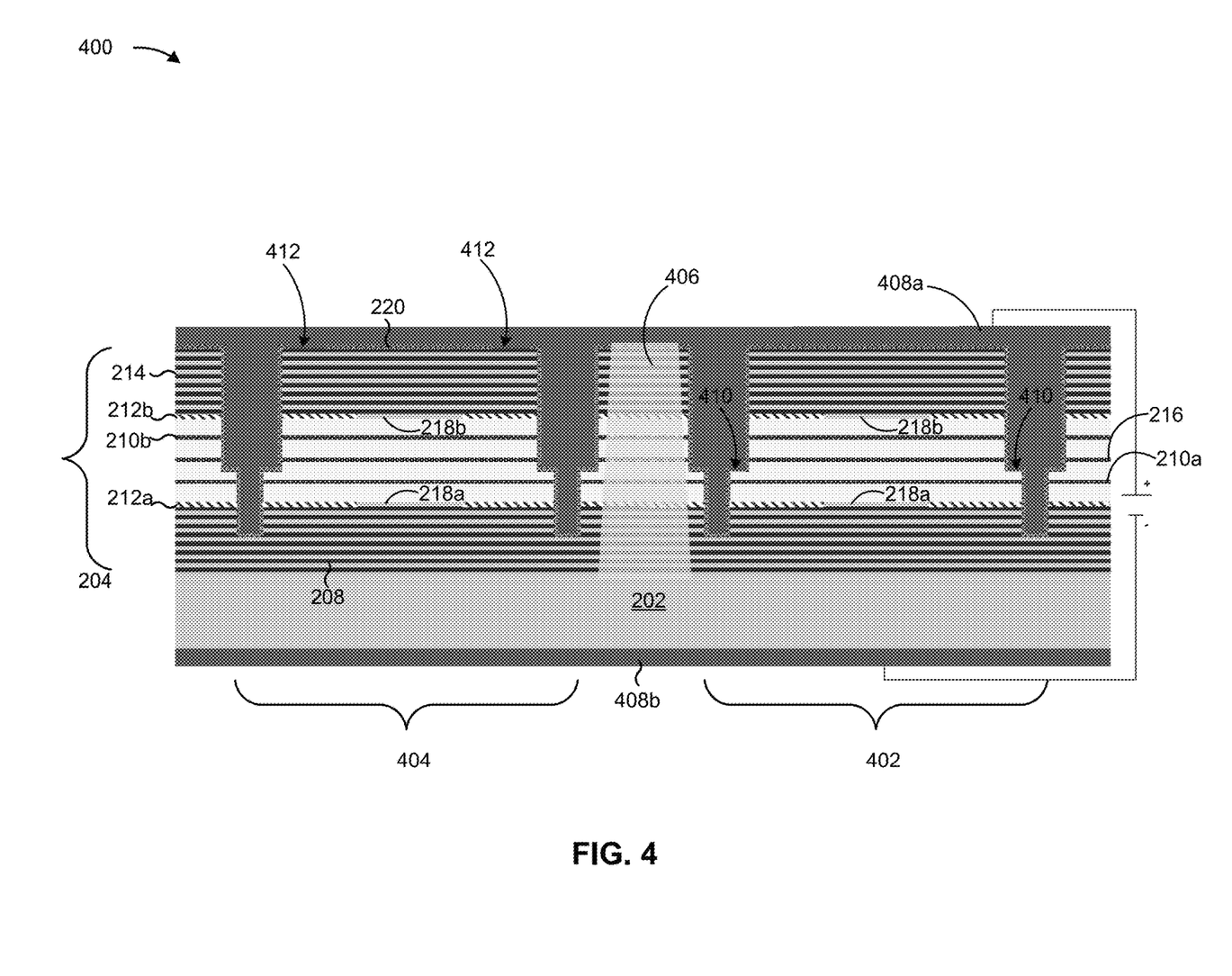
FIG. 4 is a diagram of an example cross-section of an emitter array described herein.

FIG. 4 is a diagram of an example cross-section of an emitter array 400. FIG. 4 illustrates a top-emitting configuration of the emitter array 400, however, a bottom-emitting configuration is also contemplated. As shown in FIG. 4, the emitter array 400 may include a common substrate 202 and a common epitaxial structure 204, as described above in connection with FIG. 2. The epitaxial structure 204 may include a bottom mirror 208, one or more active layers 210a, 210b, one or more confinement layers 212a, 212b, a top mirror 214, a tunnel junction region 216 between the active layers 210a and 210b, and an electrical isolation layer 220, as described above in connection with FIG. 2.

In addition, the emitter array 400 may include at least a first emitter 402 and a second emitter 404 (e.g., in parallel) defined in the epitaxial structure 204. The first emitter 402 and the second emitter 404 may be emitters 100 as described above in connection with FIGS. 1A and 1B. For example, the first emitter 402 and the second emitter 404 may be VCSELs.

The first emitter 402 and the second emitter 404 may be separated by an implant region 406. The implant region 406 may include a highly-resistive ion that provides electrical isolation between the first emitter 402 and the second emitter 404. The implant region 406 may define a first region of the emitter array 400 associated with the first emitter 402 (i.e., to a right side of the implant region 406), and a second region of the emitter array 400 associated with the second emitter 404 (i.e., to a left side of the implant region 406).

The emitter array 400 may include a set of contacts 408 (shown as 408a and 408b). As shown in FIG. 4, the set of contacts 408 may include an anode contact 408a (e.g., that provides one or more anode contact points to the epitaxial structure 204) and a cathode contact 408b (e.g., that provides one or more cathode contact points to the epitaxial structure 204). The anode contact 408a may include a contact layer formed in a plurality of trenches etched into the epitaxial structure 204. The plurality of trenches may be configured similarly to the trenches described above in connection with FIG. 2. The anode contact 408a may provide at least one electrical contact point at a top surface of the epitaxial structure 204 and at least one electrical contact point within a trench. The cathode contact 408b may include a layer at a backside of the emitter array 400 in electrical contact with the substrate 202, as described above. Alternatively, the cathode contact 408b may include a layer at a top side of the emitter array 400 (i.e., a same side as the anode contact 408a) that is formed in a trench that extends into, and provides an electrical connection to, the substrate 202.

As shown in FIG. 4, the emitter array 400 includes a single cathode contact 408b and a plurality of anode contact points that are electrically connected to form the anode contact 408a. However, in some implementations, the emitter array 400 may include a single anode contact and a plurality of cathode contact points that are electrically connected to form a single cathode contact, in a manner similar to that described above in connection with FIG. 3.

In some implementations, the emitter array 400 may be connected to a driver component (e.g., a driver circuit). The driver component may be configured to apply a bias to the emitter array 400 via the anode contact 408a and the cathode contact 408b.

The set of contacts 408 may be electrically connected to the epitaxial structure 204 to provide current to only the first active layer 210a (e.g., not to the second active layer 210b) for the first emitter 402, and provide current to both the first active layer 210a and the second active layer 210b for the second emitter 404. For example, the set of contacts 408 may be configured to provide single-junction operation of the first emitter 402 and multi junction operation of the second emitter 404, as described above.

In some implementations, the anode contact 408a may have multiple electrical connection points to the epitaxial structure 204 at different depths in the epitaxial structure 204. The different depths may be associated with different emitters. In connection with the first emitter 402 (e.g., in the first region of the emitter array 400), the anode contact 408a may have one or more first electrical connection points between the first active layer 210a and the second active layer 210b (e.g., between the tunnel junction region 216 and the first active layer 210a, or between the tunnel junction region 216 and the second active layer 210b). For example, as shown by reference number 410, the electrical isolation layer 220 may include a gap at a lateral section of a trench, as described above, to provide the one or more first electrical connection points. In connection with the second emitter 404 (e.g., in the second region of the emitter array 400), the anode contact 408a may have one or more second electrical connection points at a top surface of the epitaxial structure 204. For example, as shown by reference number 412, the electrical isolation layer 220 may include a gap at the top surface of the epitaxial structure 204, as described above, to provide the one or more second electrical connection points.

In some implementations, the emitter array 400 may operate in a constant current mode (e.g., the driver component may be configured to supply a constant current to the emitter array 400). The constant current may satisfy (e.g., may be greater than) a threshold current. For example, the threshold current may be sufficient to activate both the first active layer and the second active layer. Accordingly, in the constant current mode, the first emitter 402 and the second emitter 404 may be produce an optical output.

In some implementations, the emitter array 400 may operate in a constant voltage mode (e.g., the driver component may be configured to supply a constant voltage to the emitter array 400). The constant voltage may satisfy (e.g., may be less than) a threshold voltage. For example, the threshold voltage may be sufficient to activate the first active layer but not the second active layer (e.g., the threshold voltage may be less than a turn-on voltage of the emitter 404). Accordingly, in the constant voltage mode, only the first emitter 402 may produce an optical output. In this way, a combined optical output power of the emitter array 400 may be switched between a relatively higher combined optical output power (e.g., when both emitters 402, 404 are on) and a relatively lower combined optical output power (e.g., when only the emitter 402 is on and the emitter 404 is off).

In other words, a quantity of emitters of the emitter array 400 that are on in the constant voltage mode (e.g., less than all of the emitters, such as the first emitter 402) may be different from a quantity of emitters of the emitter array 400 that are on in the constant current mode (e.g., all of the emitters, such as the first emitter 402 and the second emitter 404). In this way, a quantity of emitters of the emitter array 400 that are on may change as the emitter array 400 switches between operating in the constant current mode and the constant voltage mode. This may be useful, for example, to enable a device using the emitter array 400 to switch between different effective spatial resolutions.

The emitter array 400 may include more than two active layers, as described above. Moreover, although the emitter array 400 is described above as including two emitters, the emitter array 400 may include more than two emitters. For example, the emitter array 400 may include a first plurality of emitters (forming a first sub-array) that are configured as described for the first emitter 402, and a second plurality of emitters (forming a second sub-array) that are configured as described for the second emitter 404 (and additional sub-arrays for additional active layers of the emitter array 400). In some implementations, an optical source (e.g., a laser) may include an emitter array. The emitter array may include at least one emitter, such as the emitter 200 and/or the emitter 300. Additionally, or alternatively, the emitter array may include the emitter array 400.

As indicated above, FIG. 4 is provided as an example. Other examples may differ from what is described with regard to FIG. 4. The quantity and arrangement of layers shown in FIG. 4 are provided as an example. In practice, the emitter array 400 may include additional layers, fewer layers, different layers, or differently arranged layers than those shown in FIG. 4. For example, the emitter array 400 may be modified as needed for sufficient carrier confinement (e.g., by including additional confinement layers, by increasing a spacing between active layers, by modifying doping in, and adjacent to, contact layers, and/or the like). Additionally, or alternatively, a set of layers (e.g., one or more layers) of the emitter array 400 may perform one or more functions described as being performed by another set of layers of the emitter array 400.

The foregoing disclosure provides illustration and description, but is not intended to be exhaustive or to limit the implementations to the precise form disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein the term "layer" is intended to be broadly construed as one or more layers and includes layers oriented horizontally, vertically, or at other angles.

As used herein, satisfying a threshold may, depending on the context, refer to a value being greater than the threshold, greater than or equal to the threshold, less than the threshold, less than or equal to the threshold, equal to the threshold, etc., depending on the context.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "above," "upper," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. A vertical cavity surface emitting laser (VCSEL), comprising:
    an epitaxial structure that includes a first active layer, a second active layer, and a tunnel junction therebetween; and
    a set of contacts that are electrically connected to the epitaxial structure,
        wherein the set of contacts includes three or more contacts,
        wherein the set of contacts are electrically separated from each other on the VCSEL, and
        wherein a first contact, of the set of contacts, is electrically connected to the epitaxial structure via a first gap in an electrical isolation layer at a depth between the first active layer and the second active layer, and a portion of the first contact extends below the first active layer,
        wherein a second contact, of the set of contacts, is electrically connected to the epitaxial structure via a second gap in the electrical isolation layer at a depth above the first active layer and the second active layer, and a portion of the second contact extends below the first active layer, and
        wherein a third contact, of the set of contacts, is located below the epitaxial structure.

2. The VCSEL of claim 1, wherein each contact, of the set of contacts, is electrically connected to the epitaxial structure at a depth that is different from a depth at which any other contact, of the set of contacts, is electrically connected to the epitaxial structure.

3. The VCSEL of claim 1, wherein the epitaxial structure includes at least one trench that is lined with the electrical isolation layer, and
    wherein the first contact electrically connects to the epitaxial structure within the trench.

4. The VCSEL of claim 3, wherein the electrical isolation layer, associated with a lateral section of the at least one trench, includes the first gap to form the first contact into the epitaxial structure.

5. The VCSEL of claim 4, wherein the at least one trench extends beyond the first gap into a substrate layer of the epitaxial structure to provide electrical isolation from another contact, of the set of contacts, or another VCSEL in an array with the VCSEL.

6. The VCSEL of claim 1, wherein the depth at which the first contact is electrically connected to the epitaxial structure is between the tunnel junction and the first active layer.

7. The VCSEL of claim 1, wherein the epitaxial structure includes one or more confinement layers at a depth above the second active layer.

8. The VCSEL of claim 7, wherein the one or more confinement layers are oxide layers.

9. The VCSEL of claim 7, wherein the epitaxial structure includes one or more additional confinement layers at a depth below the first active layer.

10. The VCSEL of claim 9, wherein the one or more confinement layers and the one or more additional confinement layers are vertically aligned.

11. The VCSEL of claim 1, wherein the epitaxial structure includes a third active layer and an additional tunnel junction,
    wherein the additional tunnel junction is at a depth in the epitaxial structure between the second active layer and the third active layer, and
    wherein the set of contacts are electrically connected to the epitaxial structure such that select pairs of contacts, of the set of contacts, provide electrical current to a subset of the first active layer, the second active layer, and the third active layer.

12. The VCSEL of claim 1, wherein the first active layer and the second active layer are in a first electrical path between a first pair of contacts, of the set of contacts, and only one of the first active layer and the second active layer is in a second electrical path between a second pair of contacts of the set of contacts.

13. The VCSEL of claim 1, wherein the set of contacts are configured to selectively provide electrical current to only one of, or both of, the first active layer and the second active layer.

14. A vertical cavity surface emitting laser (VCSEL) array comprising at least one VCSEL, the at least one VCSEL comprising:
    an epitaxial structure that includes a first active layer, a second active layer, and a tunnel junction therebetween; and
    a set of contacts that are electrically connected to the epitaxial structure,
        wherein the set of contacts includes three or more contacts,
        wherein the set of contacts are electrically separated from each other on the VCSEL, and
        wherein a first contact, of the set of contacts, is electrically connected to the epitaxial structure via a first gap in an electrical isolation layer at a depth between the first active layer and the second active layer, and a portion of the first contact extends below the first active layer,
        wherein a second contact, of the set of contacts, is electrically connected to the epitaxial structure via a second gap in the electrical isolation layer at a depth above the first active layer and the second active layer, and a portion of the second contact extends below the first active layer, and
        wherein a third contact, of the set of contacts, is located below the epitaxial structure.

15. The VCSEL array of claim 14, wherein each contact, of the set of contacts, is electrically connected to the epitaxial structure at a depth that is different from a depth at which any other contact, of the set of contacts, is electrically connected to the epitaxial structure.

16. The VCSEL array of claim 14, wherein the epitaxial structure includes at least one trench that is lined with the electrical isolation layer, and
    wherein the first contact electrically connects to the epitaxial structure within the trench.

17. The VCSEL array of claim 16, wherein the electrical isolation layer, associated with a lateral section of the at least one trench, includes the first gap to form the first contact into the epitaxial structure.

18. The VCSEL array of claim 17, wherein the at least one trench extends beyond the first gap into a substrate layer of the epitaxial structure to provide electrical isolation from another contact, of the set of contacts, or another VCSEL in an array with the VCSEL.

19. The VCSEL array of claim 14, wherein the depth at which the first contact is electrically connected to the epitaxial structure is between the tunnel junction and the first active layer.

20. The VCSEL array of claim 14, wherein the epitaxial structure includes one or more confinement layers at a depth above the second active layer.

\* \* \* \* \*